United States Patent
Wu et al.

(10) Patent No.: US 6,731,015 B2
(45) Date of Patent: May 4, 2004

(54) SUPER LOW PROFILE PACKAGE WITH STACKED DIES

(75) Inventors: Chi-Chuan Wu, Taichung (TW); Tzong-Dar Her, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/026,452

(22) Filed: Dec. 27, 2001

(65) Prior Publication Data
US 2003/0025199 A1 Feb. 6, 2003

(30) Foreign Application Priority Data
Aug. 1, 2001 (TW) ........................................ 90118812 A

(51) Int. Cl.[7] ........................ H01L 23/495; H01L 23/28
(52) U.S. Cl. ...................... 257/796; 257/676; 257/777; 257/778; 257/707
(58) Field of Search ................. 257/707, 777, 257/778, 724, 796, 713, 719, 720, 676, 706; 438/122

(56) References Cited

U.S. PATENT DOCUMENTS

| | | | | |
|---|---|---|---|---|
| 5,586,010 A | * | 12/1996 | Murtuza et al. | ............ 361/751 |
| 5,814,877 A | * | 9/1998 | Diffenderfer et al. | ........ 257/666 |
| 6,084,308 A | * | 7/2000 | Kelkar et al. | ................ 257/777 |
| 6,160,705 A | * | 12/2000 | Stearns et al. | .............. 361/704 |
| 6,380,631 B2 | * | 4/2002 | Mess et al. | .................. 257/777 |
| 6,452,278 B1 | * | 9/2002 | DiCaprio et al. | ............ 257/777 |
| 2002/0109226 A1 | * | 8/2002 | Khan et al. | .................. 257/737 |

* cited by examiner

Primary Examiner—Jerome Jackson
Assistant Examiner—Matthew C Landau
(74) Attorney, Agent, or Firm—Rabin & Berdo, PC

(57) ABSTRACT

A super low profile package with stacked dies comprises a substrate, a heat spreader, a first die, a second die, a molding compound, and a number of solder balls. The substrate has a cavity, a top surface and a bottom surface opposite to the top surface. The heat spreader is connected to the bottom surface of the substrate, and a portion of the heat spreader opposite to the cavity serves as a die pad. The first die seated in the cavity is attached to the die pad while the second die seated in the cavity is attached to the first die, and both dies are wire-bonded to the substrate for electrical connection. The molding compound fills the cavity and encapsulates the first die, the second die, the heat spreader, and part of the bottom surface of the substrate. Numerous solder balls are attached to the bottom surface of the substrate. The benefits resulting from the package of the invention include a reduction of profile, a simple manufacturing process, and a low prime cost.

16 Claims, 6 Drawing Sheets

SUPER LOW PROFILE PACKAGE WITH STACKED DIES

This application incorporates by reference Taiwanese application Serial No. 90118812, Filed Aug. 1, 2001.

BACKGROUND OF THE INVENTION

1. Field of the Invention

The invention relates in general to a package for integrated circuits and more particularly to a super low profile package with stacked dies.

2. Description of the Related Art

The technology of integrated circuit (IC) has been usually applied in the various electronic products. The current trend of the electronic products is towards the smaller, thinner, and lighter. Therefore, one important research of IC design focuses on how to improve and minimize the size of the IC package so as to fit in with those smaller electronic products.

Since the integrated circuit (IC) design becomes more and more delicate and complicated, the package with double dies has been commonly adopted for meeting the requirement of the IC design. Typically, the packages could be divided into "cavity up" packages and "cavity down" packages in accordance with the way of die attachment. Please refer to FIG. 1, which is a cross-sectional view of a conventional cavity-up package with double dies. The die 102 is attached to the top surface 106 of the substrate 101 while the die 104 is attached on the die 102 by a thin layer of thermally conductive epoxy. The dies 102 and 104 are electrically connected to the substrate 101 by the wires 114 and 116, respectively. The molding compound 110 is formed over the substrate 101 so as to encapsulate the dies 102 and 104. A number of solder balls 112 are attached to the bottom surface 108 of the substrate 101 for electrically connecting the package 100 to an external printed circuit board (PCB) (not shown in FIG. 1).

FIG. 2 is a cross-sectional view of a conventional cavity-down package with double dies. The package 200 with double dies of FIG. 2 is constructed in accordance with the single-die package design disclosed in U.S. Pat. No. 5,397,921, entitled "TAB Grid Array", issued Mar. 14, 1995 to Advanced Semiconductor Assembly Technology. The substrate 201 of the package 200 comprises the dielectric layers 201A and 201C, and the pad (conductor) layer 201B. The substrate 201 further has a cavity, through the dielectric layers 201A, 201B and the pad layer 201B, for placing the die 202. In addition, there is a heat spreader 218 attached to the substrate 201 by a thin film layer of adhesive 220. Also, the heat spreader 218 has a cavity for placing the dies 202 and 204, while the die 204 is attached to the heat spreader 218 and the die 202 is attached to the die 204 both by a thin layer of thermally conductive epoxy. Simultaneously, the dies 202 and 204 are wire-bonded to the pad layer 201B for achieving the electrically connection. Furthermore, the cavity is filled with an encapsulation material (molding compound) 210 for encapsulating the dies 202 and 204. The numerous solder balls 212 are attached to the dielectric layer 201C of the substrate 201 for electrically connecting the integrated circuit to metallic traces on an external PCB (not shown in FIG. 2).

According to the description above, the overall thickness of the package 100 in FIG. 1 is equal to the sum of the thickness of the molding compound 110, the thickness of the substrate 101, and the height of the solder ball 112, wherein the thickness of the molding compound 110 is positively related to the thickness of the dies 102 and 104, and the loop height of the wire 116. Similarly, the overall thickness of the package 200 in FIG. 2 is determined by the thickness of the heat spreader 218, the thickness of the substrate 201, and the height of the solder ball 212, wherein the thickness of the heat spreader 218 is positively related to the thickness of the dies 202 and 204. Since the thickness of the dies 102, 104, 202, and 204 directly relate to the overall thickness (profile) of the packages 100 and 200, the packages 100 and 200 encapsulated with the over-thick dies 102, 104, 202, and 204 can not well fit in with the small and delicate electronic products.

FIG. 3 is a cross-sectional view of another conventional package with double dies. The package 300 with double dies in FIG. 3 is constructed in accordance with the single-die package design disclosed in U.S. Pat. No. 5,696,666, entitled "Low Profile Exposed Die Chip Carrier Package", issued Dec. 9, 1997 to Motorola, Inc. The substrate 301 of the package 300 in FIG. 3 has an open-through cavity 320 for placing the die 302. The die 304 is mounted on the die 302 by a thin film of the conductive epoxy. The dies 302 and 304 are electrically connected to the substrate 301 by the wires 314 and 316, respectively. After wire bonding, an encapsulation material (encapsulant or molding compound) is applied over the top surface 306 of the substrate 301, thereby encapsulates the dies 302 and 304. Also, the solder balls 312 are attached to the bottom surface 308 of the substrate 301.

FIG. 4A~FIG. 4D show the process of manufacturing the package of FIG. 3. First, a cavity 320 is formed through the substrate 301, and the bottom surface 308 of the substrate 301 is temporarily taped by a tape 432 in order to seal one side of the cavity 320, as shown in FIG. 4A.

Next, the die 302 is seated in the cavity 302 and carried by the tape 432, as shown in FIG. 4B. In other words, the tape 432 provides the mechanical support for the die 302. Then, the die 304 is attached on the top of the die 302 by a conductive epoxy. The dies 302 and 304 are respectively wire-bonded to the substrate 301 through the wires 314 and 316. After wire bonding, the encapsulation material, such as a plastic resin, is applied in the peripheral of the dies 302 and 304 in place, so that the dies 302 and 304 are encapsulated and well held in the cavity 320.

Since the die 302 is well fixed in the cavity 320 after encapsulating process, there is no need for using the tape 432 as a carrier of the die 302. So, the de-taping procedure, which is the removal of the tape 432, can be performed as shown in FIG. 4C. Accordingly, the back surface 302A of the die 302 is exposed to the atmosphere.

After de-taping, the solder ball attachment is performed as shown in FIG. 4D. Numerous solder balls 312 are attached to the bottom surface 308 of the substrate 301 as an array format, and the package 300 in FIG. 3 is thereby obtained in accordance with the forgoing process.

Comparatively speaking, the encapsulation material 310 of the package 300 in FIG. 3 is thinner than the molding compound 110 of the package 100 in FIG. 1, which results from the substrate 301 having a capacity (cavity 302) for the die 302. So, the overall thickness of the package 300 is smaller than that of the package 100. However, the integration of the taping and de-taping procedures makes the process of manufacturing package 300 more complicate, which thereby decreases the production efficiency and even increases the prime cost greatly.

SUMMARY OF THE INVENTION

It is therefore an object of the invention to provide a super low profile package with stacked dies and the method of manufacturing the same. The package of the invention possesses small size, thin profile, and good efficiency of heat dissipation. In addition, the process of manufacturing the package of the invention is simplified by eliminating the conventional procedures of taping and de-taping, so that the prime cost is significantly reduced.

The invention achieves the above-identified objects by providing a super low profile package with stacked dies, comprising: a substrate, a heat spreader, a first die, a second die, a molding compound, and a number of solder balls. The substrate has a cavity, a top surface and a bottom surface opposite to the top surface. The heat spreader is connected to the bottom surface of the substrate. A portion of the heat spreader opposite to the cavity serves as a die pad. The first die seated in the cavity is attached to the die pad, and electrically connected to the substrate by the wire. The second die seated in the cavity is attached to the first die, and also electrically connected to the substrate by the wire. The molding compound fills the cavity and encapsulates the first die, the second die, the heat spreader, and part of the bottom surface of the substrate. Additionally, a number of solder balls are attached to the bottom surface of the substrate.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The super low profile package according to the invention is characterized by having a cavity through a substrate for placing the stacked dies, and a heat spreader not only for heat dissipation but also providing support for the dies as a die pad. The cavity is filled with the molding compound (encapsulation material), and the portion of the bottom surface of the substrate is also covered with the molding compound. The solder balls are attached to the bottom surface of the substrate. Thus, the objective of the invention for reducing package height is successfully achieved. The overall thickness of the super low profile package of the invention is only contributed by the thickness of the substrate and the solder ball.

In the following description, specific details are set forth in order to provide a thorough understanding of the invention.

Figure 5A:
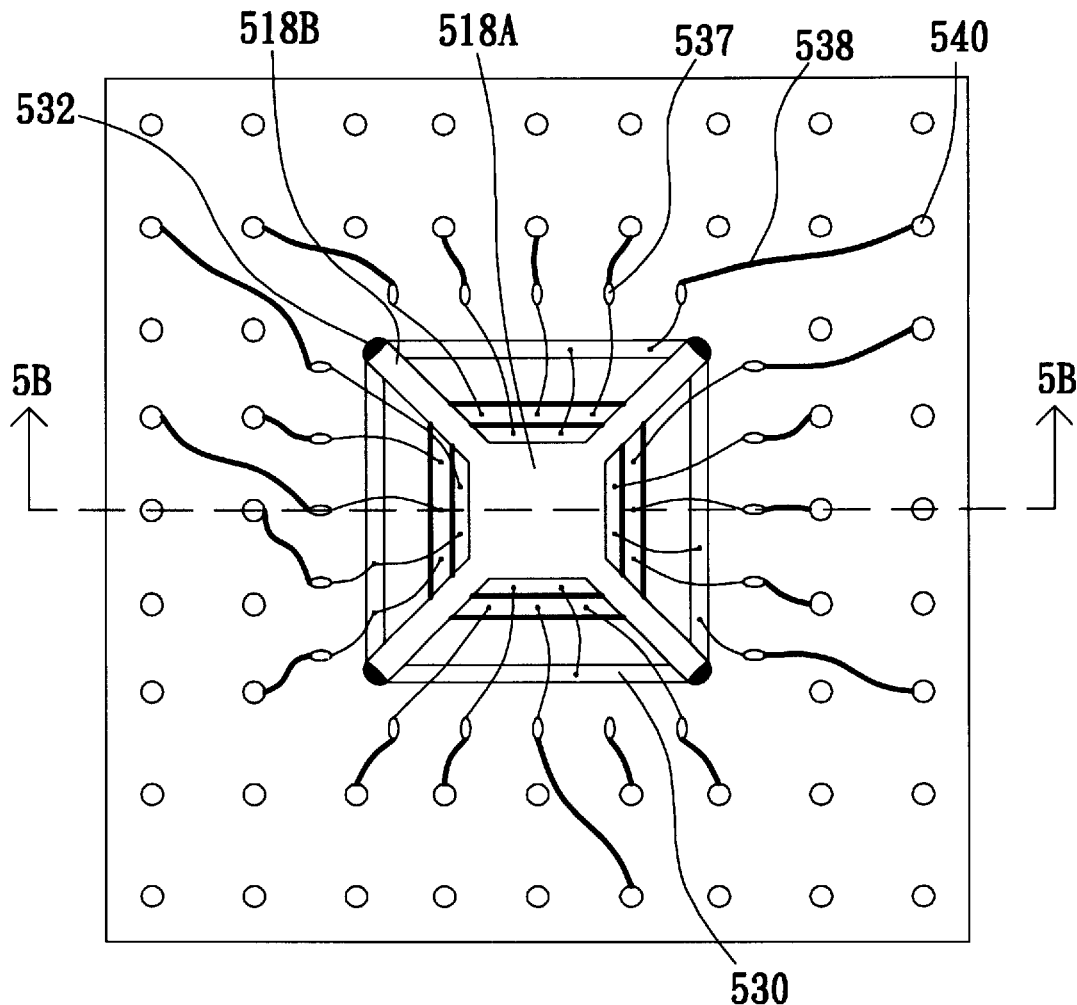
FIG. 5A is an upward view of a super low profile package with stacked dies according to the first embodiment of the invention.
Figure 5B:
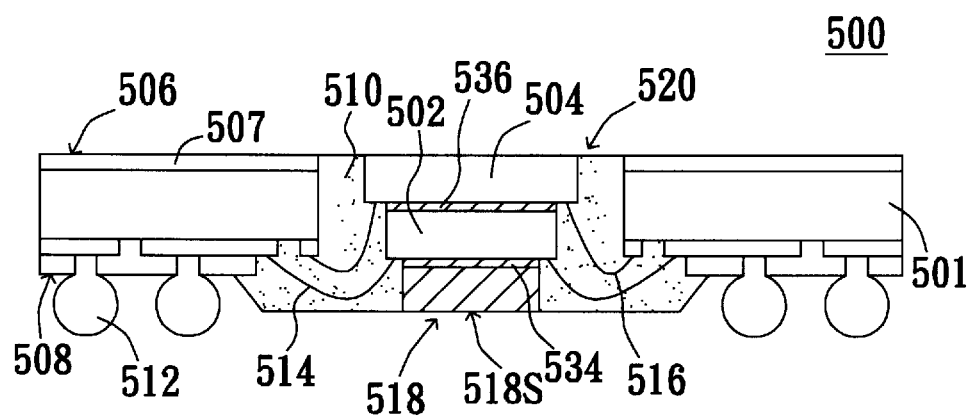
FIG. 5B is a cross-sectional view of the package of FIG. 5A through section 5B—5B.

FIG. 5A shows the upward view of a super low profile package with stacked dies according to the first embodiment of the invention. FIG. 5B is a cross-sectional view of the package of FIG. 5A through section 5B—5B. In order to avoid obscuring the illustration and description below, the molding compound 510 and the solder balls 512 are not shown in FIG. 5A. Moreover, in the preferred embodiment, the package with two dies is taken for illustration and description, but the invention is applicable for the package with multiple stacked dies. Accordingly, the specification and drawings are to be regarded in an illustrative rather than a restrictive sense.

As shown in FIG. 5A and FIG. 5B, the super low profile package 500 of the invention comprises a substrate 501, a heat spreader 518, the dies 502 and 504, the molding compound 510, and a number of solder balls 512. The substrate 501 has an open-through cavity 520, a top surface 506, and a bottom surface 508. The bottom surface 508 and the top surface 506 are opposite. The heat spreader 518, attached to the bottom surface 508 of the substrate 501, consists of a central part 518A and the extending parts 518B. Structurally, the central part 518A of the heat spreader 518, serving as a die pad and opposite to the cavity 520, provides mechanical support for the die 502. The extending parts 518B of the heat spreader 518 are attached to the bottom surface 508 of the substrate 501 for fixation of the heat spreader 518. The die 502 seated in the cavity 520 is attached to the central part 518A of the heat spreader 518, and electrically connected to the substrate 501. Also, the die 504 seated in the cavity 520 is mounted on the die 502 by a thin layer of conductive epoxy, and electrically connected to the substrate 501. The molding compound 510 fills the cavity 520, encapsulates the dies 502, 504, the heat spreader 518, and the portion of the bottom surface 508 of the substrate 501. Numerous solder balls 512 are attached to the bottom surface 508 of the substrate 501.

According to the illustration of FIG. 5A, the extending parts 518B of the heat spreader 518 consists of multiple bars while the central part 518A of the heat spreader 518 is a rectangular plate. However, the central part 518A is not limited hereto. Other modifications, such as a round shape, a grid plate, or other structure, are also applicable. It will be appreciated by one skilled in the art that the structure of the heat spreader 518 may be modified without beyond the spirit of the invention.

Moreover, there is a ground ring 530 on the substrate 501 which is situated around the periphery of the cavity 520. The ends of the extending parts 518B of the heat spreader 518 are connected to the ground ring 530 by a joint material 532. The joint material 532 can be an epoxy resin or a solder, as known in the art. In addition, a ground plane 507, such as copper foil, is attached to the top surface 506 of the substrate 501 for increasing the electricity characteristics and decreasing the noise disturbance further. Such ground connection, created by the ground ring 530 and the ground plane 507, provides not only a ground path of controlled and predictable impedance with lower electrical parasitics, but extends the performance of the package of the invention.

The dies 502 and 504 are electrically connected to the substrate 501 by the wires 514 and 516, respectively. The die 502, with an active surface facing down, is attached to the central part 518A of the heat spreader 518 by a thin layer of adhesive 534, and similarly, the die 504, with an active surface facing down, is attached to the die 502 by a thin layer of adhesive 536. Furthermore, the active surfaces of the dies 502 and 504 have the electricity-output terminals (not shown) to solder the wires 514 and 516 thereon.

The area of central part 518A of the heat spreader 518, serving as a die pad, is smaller than that of the active surface of the die 502, as shown in FIGS. 5A and 5B. This design makes the electricity-output terminals of the die 502 visible and exposed around the central part 518A so that the wire 514 is able to connect the die 502 and the substrate 501. Similarly, the area of the active surface of the die 502 is smaller than that of the die 504, so that the electricity-output terminals of the die 504 are exposed for bonding the wire 516 successfully. The other ends of the wires 514 and 516 are either connected to the ground ring 530 of the substrate 501 for ground connection, or connected to the pads 537 of the substrate 501 for signal connection. By the electrically conductive traces 538, the pads 537 are electrically connected to the solder ball pads 540 that are the place for attaching the solder balls 512.

In the preferred embodiment described above, since the portion of the heat spreader 518, such as the surface 518S of the heat spreader 518, is uncovered by the molding compound 510, and the back surface of the die 504 is also exposed to the atmosphere, the heat generated by the dies 502 and 504 is more efficiently dissipated.

Figure 6A:
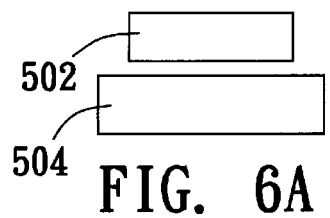
FIG. 6A~FIG. 6E show the process of manufacturing the super low profile package of FIGS. 5A and 5B.
Figure 6B:
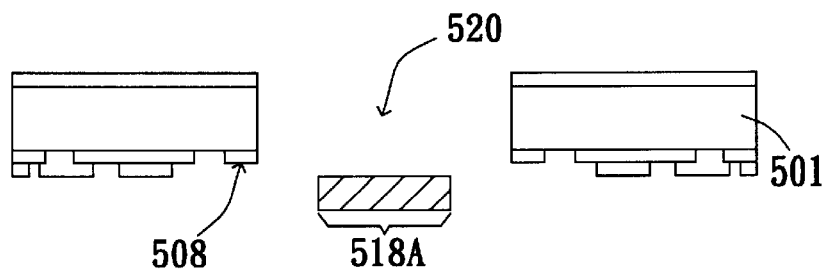
Figure 6C:
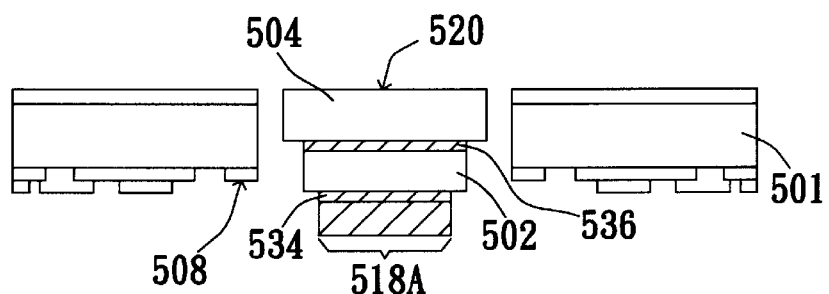
Figure 6D:
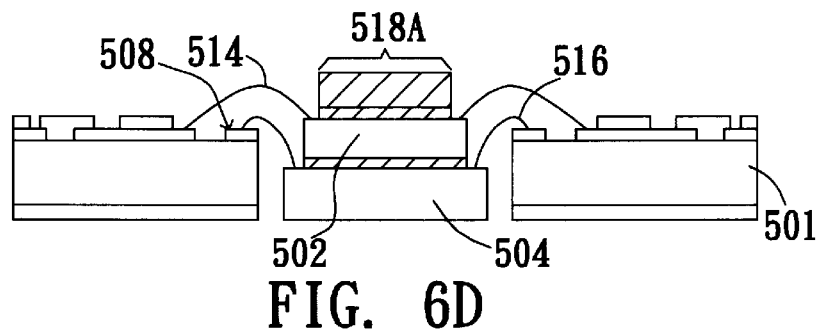
Figure 6E:
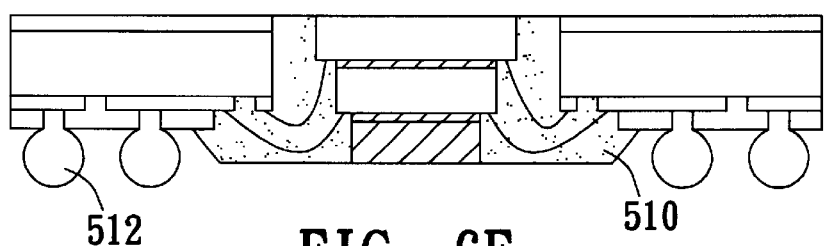

FIG. 6A–FIG. 6E show the process of manufacturing the super low profile package of FIG. 5A and FIG. 5B. First, the dies 502 and 504 are provided, as shown in FIG. 6A. Next, the heat spreader 518 is attached to the bottom surface 508 of the substrate 501. The central part 518A of the heat spreader 518 serving as a die pad is opposite to the cavity 520, as shown in FIG. 6B. Then, the active surface of the die 502 is attached to the central part 518A of the heat spreader 518 while the active surface of the die 504 is attached to the back surface of the die 502, and both of the dies 502 and 504 are seated inside the cavity 520, as shown in FIG. 6C. Afterward, the substrate 501 is turned over, the bottom surface 508 facing up, for proceeding wire bonding, which the dies 502 and 504 are electrically connected to the substrate 501 by wires 514 and 516, as shown in FIG. 6D. The wire 516 connects the electricity-output terminal (not shown in FIG. 6D) formed on the active surface of the die 504 and the conductive pad (not shown in FIG. 6D) formed on the bottom surface 508 of the substrate 501. Similarly, the wire 514 connects the electricity-output terminal (not shown in FIG. 6D) formed on the active surface of the die 502 and the conductive pad (not shown in FIG. 6D) formed on the bottom surface 508 of the substrate 501. After wire bonding, the molding compound (encapsulation material) 510 fills the cavity 520 for encapsulating the dies 502 and 504, and covers the heat spreader 518 and part of the bottom surface 508 of the substrate 501, as shown in FIG. 6E. Further, a number of solder balls 512 are attached to the bottom surface 508 of the substrate 501.

In the aforementioned process, the extending parts 518B of the heat spreader 518 are attached to the ground ring 530, placed on the substrate 501, by the joint material 532 such as the epoxy resin or solder. The die 502, with an active surface facing down, is attached to the central part 518A of the heat spreader 518 by the adhesive 534, and also, the die 504 is attached to the back surface of the die 502 by the adhesive 536. Both of the dies 502 and 504 are electrically connected to the substrate 501 by wire bonding. After encapsulating, the back surface of the die 504 and the portion of the heat spreader 518, such as the surface 518S, are uncovered with the molding compound 510 and exposed to the atmosphere.

Figure 1:
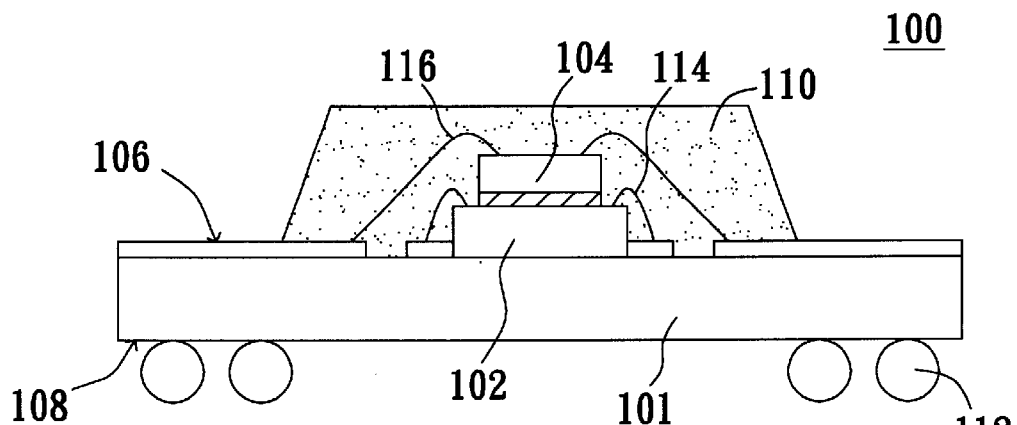
FIG. 1 (Prior Art) is a cross-sectional view of a conventional cavity-up package with double dies.
Figure 2:
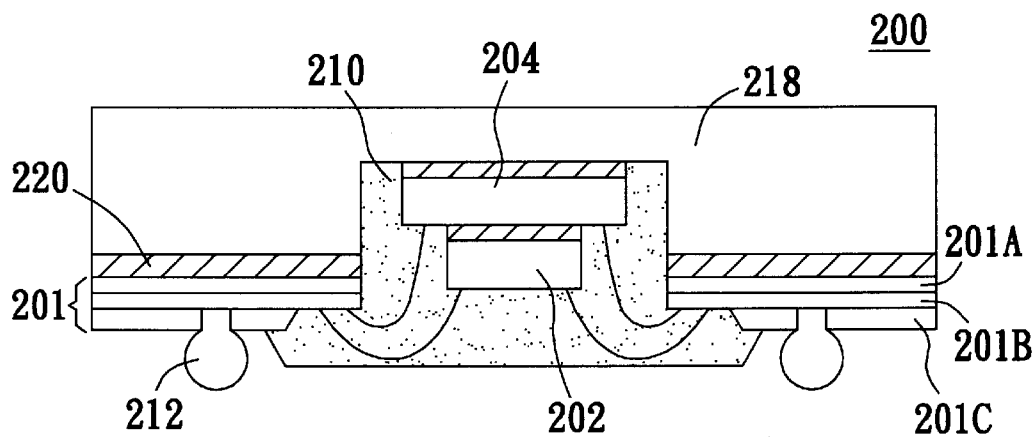
FIG. 2 (Prior Art) is a cross-sectional view of a conventional cavity-down package with double dies.
Figure 3:
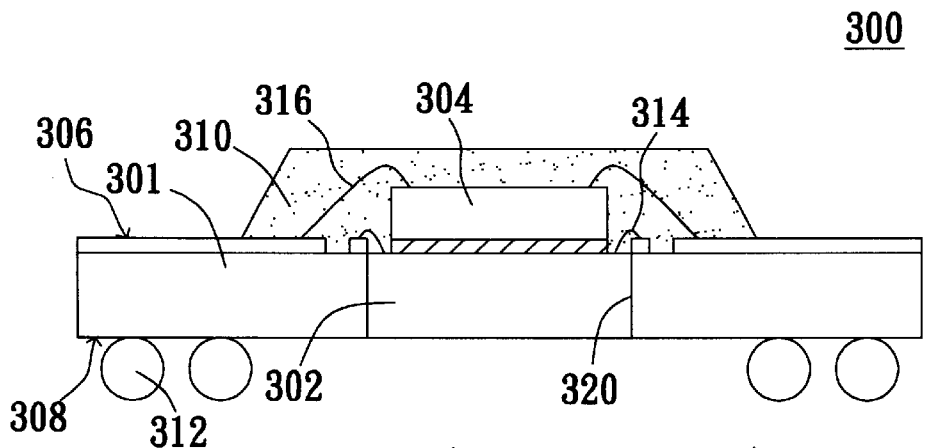
FIG. 3 (Prior Art) is a cross-sectional view of another conventional package with double dies.
Figure 4A:
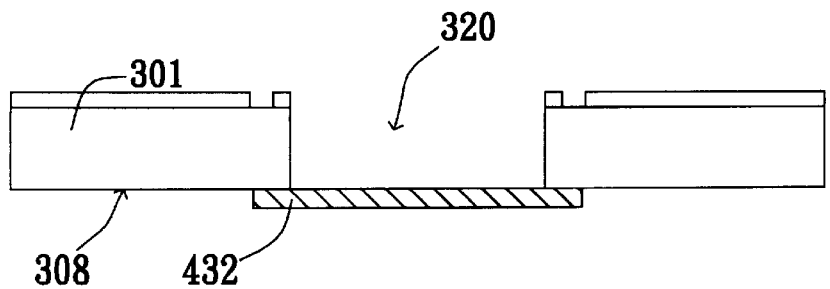
FIG. 4A~FIG. 4D (Prior Art) show the process of manufacturing the package of FIG. 3.
Figure 4B:
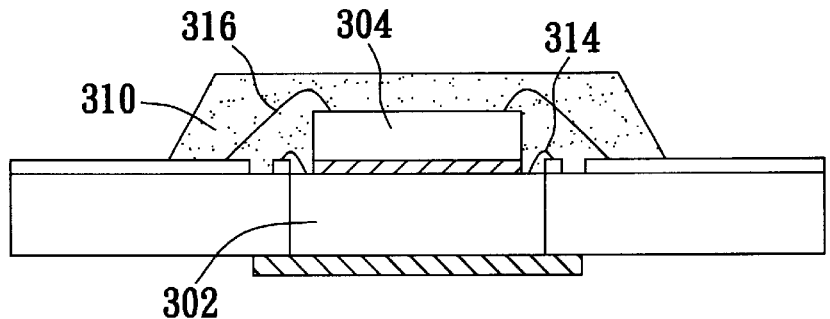
Figure 4C:
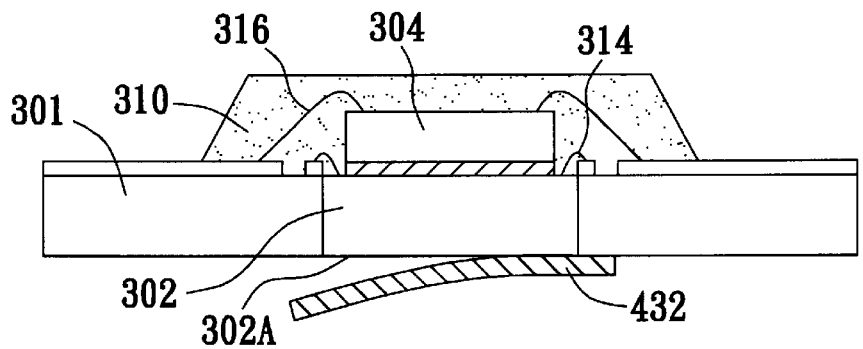
Figure 4D:
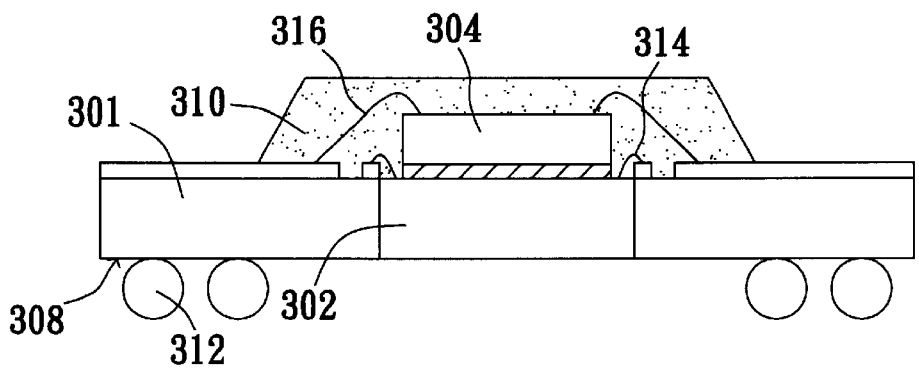

According to the foregoing description, since the dies 502 and 504 of the invention are both placed in the cavity 520 of the substrate 501 and the molding compound 510 fills the cavity 520 and reaches the height less than the diameter of the solder balls 512, the overall thickness of the package 500 (FIGS. 5A and 5B) of the invention is much smaller than that of the packages 100 (FIG. 1) and 300 (FIG. 3). Thus, the objective of decreasing the package profile is achieved. Moreover, by eliminating the conventional steps of taping and de-taping from the present process of making the package 500, an additional benefit of the invention is that the decrease of prime cost.

Figure 7:
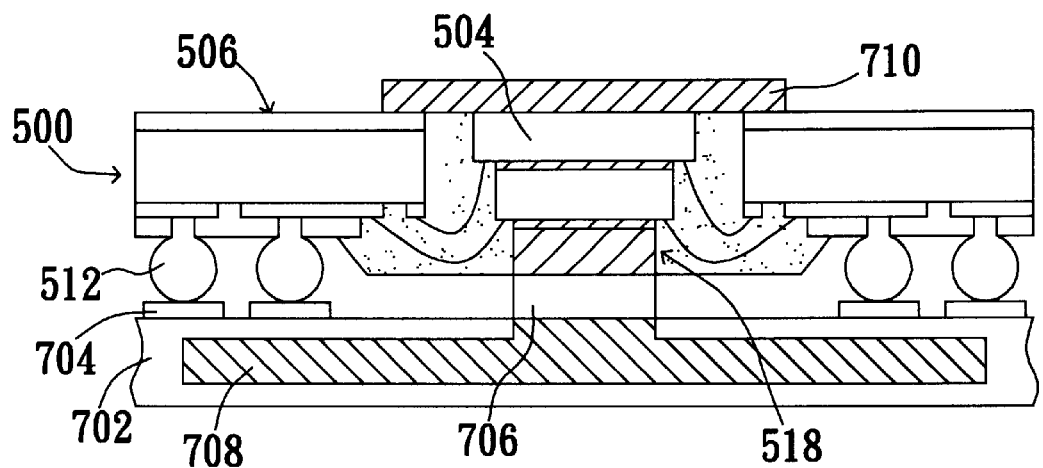
FIG. 7 is a cross-sectional view of the package of FIG. 5B assembled to a printed circuit board.

FIG. 7 shows a cross-sectional view of the package of FIG. 5B assembled to a printed circuit board. The package 500 is assembled to an external printed circuit board (PCB) 702 by soldering the solder balls 512 to the solder pads 704. The heat dissipation of the package 500 is enhanced by attaching the heat spreader 518 to a ground layer 708 of the PCB 702 through a layer of epoxy resin 706. Also, the heat dissipation could be further enhanced by attaching an additional heat spreader 710 to the top surface 506 of the substrate 501, thereby the heat generated from the die 504 can be directly dissipated through the heat spreader 710.

Figure 8:
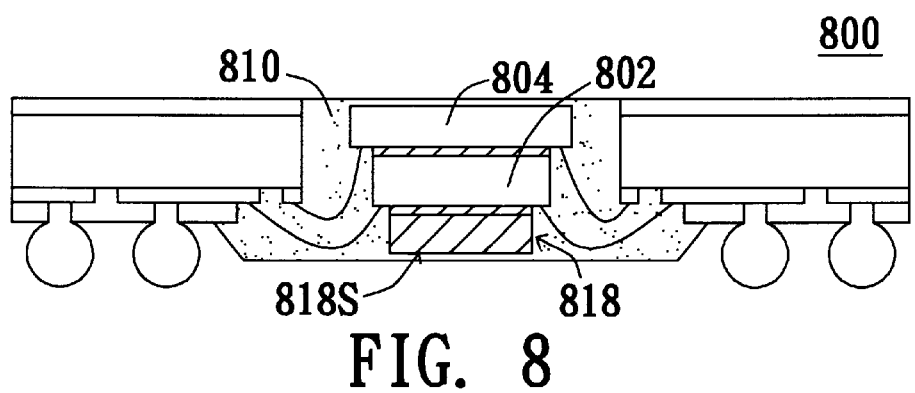
FIG. 8 is a cross-sectional view of a super low profile package with stacked dies according to the second embodiment of the invention.

FIG. 8 shows a cross-sectional view of a super low profile package with stacked dies according to the second embodiment of the invention. The main difference between the packages 800 (FIG. 8) and 500 (FIG. 5A and FIG. 5B) is that the back surface of the die 804 and the surface 818S of the heat spreader 818 are all encapsulated in the molding compound 810. Although this could make the heat dissipation efficiency slightly decreased, stresses, resulting from shrinkage of molding compound 810 as it is molded, can provide additionally mechanical support for the dies 802, 804 and the heat spreader 818.

Figure 9:
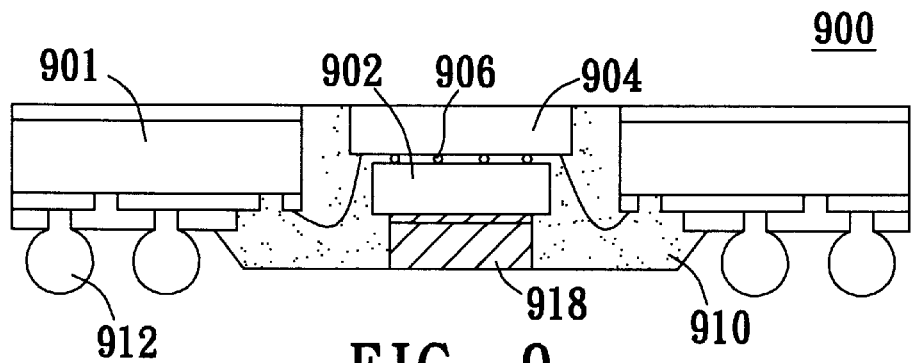
FIG. 9 is a cross-sectional view of a super low profile package with stacked dies according to the third embodiment of the invention.

FIG. 9 shows a cross-sectional view of a super low profile package with stacked dies according to the third embodiment of the invention. The main difference between the packages 900 (FIG. 8) and 500 (FIG. 5A and FIG. 5B) is the way of coupling the dies. The die 902 is coupled to the die 904 in accordance with a flip chip arrangement, which means the electrical connection of the chip to the substrate 901 is made through the solder balls 906. The flip-chip packaging technology is an advanced integrated circuit packaging technology that allows the overall package size to be made very compact, as is known in the art. The process of making the package 900 is very similar to the process of making the package 500 except the connection between the dies.

Figure 10A:
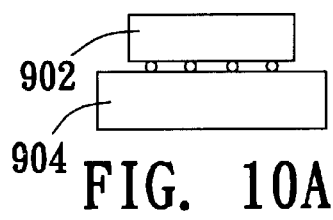
FIG. 10A~FIG. 10E show the process of manufacturing the super low profile package of FIG. 9.
Figure 10B:
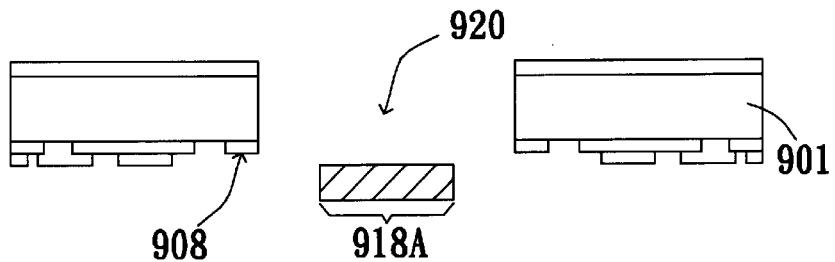
Figure 10C:
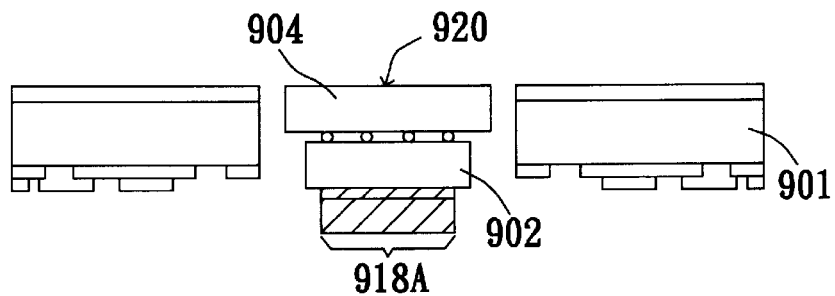
Figure 10D:
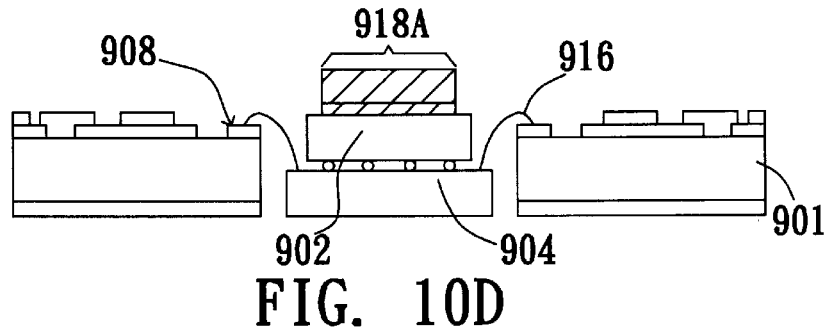
Figure 10E:
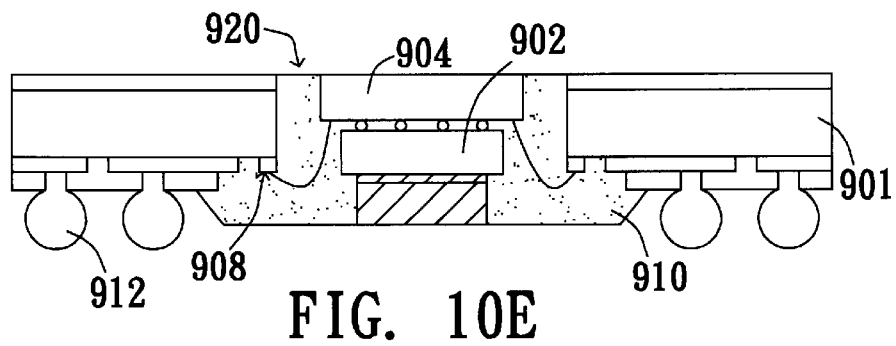

FIG. 10A–FIG. 10E show the process of manufacturing the super low profile package of FIG. 9. First, the die 902 is connected to the active surface of the die 904 in accordance with a flip chip arrangement, as shown in FIG. 10A. Next, the heat spreader 918 is attached to the bottom surface 908 of the substrate 901, which the central part 918A of the heat spreader 918 serving as a die pad is opposite to the cavity 920, as shown in FIG. 10B. Then, the back surface of the die 902 is attached to the central part 918A of the heat spreader 918 for holding both of the dies 902 and 904 inside the cavity 920, as shown in FIG. 10C. Afterward, the substrate 901 is turned over, the bottom surface 908 facing up, for proceeding wire bonding, and the dies 902, 904 are respectively electrically connect and the substrate 901, as shown in FIG. 10D. After wire bonding, the molding compound (encapsulation material) 910 fills the cavity 920 to encapsulate the dies 902 and 904, and covers the heat spreader 918 and the portion of the bottom surface 908 of the substrate 901, as shown in FIG. 10E. Further, a number of solder balls 912 are attached to the bottom surface 908 of the substrate 901.

Accordingly, the main benefit of the invention is a significantly reduced package profile resulting from the dies seating in the cavity of the substrate. The molding compound and the solder balls formed on the bottom surface of the substrate also contributes to the reduction in package height profile. Besides, the process of manufacturing the package of the invention is simpler than the conventional process. Thus, an additional benefit is a great decrease of the prime cost.

While the invention has been described by ways of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A super low profile package with stacked dies, comprising:
   a substrate having a through cavity in its center and having a top surface and a bottom surface opposite to the top surface;
   a heat spreader, which comprises:
      a base portion, and serving as a die pad for providing support; and
      an extending portion, radiating from the base portion and fixing the heat spreader onto the bottom surface of the substrate, so that the heat spreader is supported by the substrate by way of the extending portion;
   a first die seated in the cavity, wherein the first die is attached to the die pad and electrically connected to the substrate;
   a second die seated in the cavity, wherein the second die is attached to the first die and electrically connected to the substrate, wherein the first die and the second die are disposed above the heat spreader;
   a molding compound filling the cavity and encapsulating the first die, the second die, the heat spreader, and part of the bottom surface of the substrate; and
   a plurality of solder balls attached directly to the bottom surface of the substrate, wherein the heat spreader and the solder balls are both disposed on the same side of the substrate.

2. The super low profile package according to claim 1, wherein the bottom surface of the substrate further has a ground ring for ground connection, and the extending portion of the heat spreader connects and fixes the heat spreader to the ground ring.

3. The super low profile package according to claim 1, wherein the first die is electrically connected to the substrate by a wire.

4. The super low profile package according to claim 1, wherein the second die is electrically connected to the substrate by a wire.

5. The super low profile package according to claim 1, wherein the first die with an active surface facing downward is connected to the die pad by an adhesive.

6. The super low profile package according to claim 1, wherein the second die with an active surface facing downward is connected to the first die by an adhesive, and active surfaces of the first die and the second dies both are facing the same direction.

7. The super low profile package according to claim 1, wherein the first die is connected to the second die through a plurality of second solder balls in accordance with a flip chip arrangement.

8. The super low profile package according to claim 1, wherein a portion of the heat spreader is exposed to the atmosphere.

9. A super low profile package with stacked dies, comprising:
   a substrate having a through cavity in its center and having a top surface and a bottom surface opposite to the top surface;
   a heat spreader, which comprises:
      a base portion, and serving as a die pad for providing support; and
      an extending portion, radiating from the base portion and connecting and fixing the heat spreader to the bottom surface of the substrate, so that the heat spreader is supported by the substrate by way of the extending portion;
   a first die seated in the cavity, wherein the first die is attached to the die pad and electrically connected to the substrate;
   a second die seated in the cavity, wherein the second die is attached to the first die and electrically connected to the substrate, and a back surface of the second die is exposed to the atmosphere;
   a molding compound filling the cavity and encapsulating the first die, the second die, the heat spreader, and part of the bottom surface of the substrate; and
   a plurality of solder balls attached to the bottom surface of the substrate.

10. The super low profile package according to claim 9, wherein the bottom surface of the substrate further has a ground ring for ground connection, and the extending portion of the heat spreader connects and fixes the heat spreader to the ground ring.

11. The super low profile package according to claim 9, wherein the first die is electrically connected to the substrate by a wire.

12. The super low profile package according to claim 9, wherein the second die is electrically connected to the substrate by a wire.

13. The super low profile package according to claim 9, wherein the first die with an active surface facing downward is connected to the die pad by an adhesive.

14. The super low profile package according to claim 9, wherein the second die with an active surface facing downward is connected to the first die by an adhesive, and active surfaces of the first die and the second dies both are facing the same direction.

15. The super low profile package according to claim 9, wherein the first die is connected to the second die through a plurality of second solder balls in accordance with a flip chip arrangement.

16. A super low profile package with stacked dies, comprising:
   a substrate having a through cavity in its center and having a top surface and a bottom surface opposite to the top surface;
   a heat spreader, a portion of which is exposed to the atmosphere, wherein the heat spreader comprises:

a base portion, and serving as a die pad for providing support; and an extending portion, radiating from the base portion and connecting and fixing the heat spreader to the bottom surface of the substrate, so that the heat spreader is supported by the substrate by way of the extending portion;

a first die seated in the cavity, wherein the first die is attached to the die pad and electrically connected to the substrate;

a second die seated in the cavity, wherein the second die is attached to the first die and electrically connected to the substrate;

a molding compound filling the cavity and encapsulating the first die, the second die, the heat spreader, and part of the bottom surface of the substrate; and a plurality of solder balls attached to the bottom surface of the substrate;

wherein the package is further assembled to a printed circuit board (PCB) by thermally connecting the exposed heat spreader and a ground layer of the PCB through a layer of epoxy resin.

* * * * *